United States Patent [19]
Coia et al.

[11] Patent Number: 6,166,532
[45] Date of Patent: Dec. 26, 2000

[54] ELECTRICAL CIRCUIT BREAKER LOCATOR WITH TRANSMITTER AND RECEIVER

[75] Inventors: Ronald A. Coia, North Riverside, Ill.; Joachim Wottrich, Norderstedt, Germany

[73] Assignee: Unique Technologies, LLC, La Grange Park, Ill.

[21] Appl. No.: 09/061,434

[22] Filed: Apr. 17, 1998

[51] Int. Cl.[7] ............................ G01R 19/00; G01R 31/00
[52] U.S. Cl. ............................ 324/67; 324/133; 324/508
[58] Field of Search ............................ 324/67, 133, 508, 324/509, 538, 539, 541, 542; 455/3.3, 6.3

[56] References Cited

U.S. PATENT DOCUMENTS

| | | |
|---|---|---|
| 3,467,835 | 9/1969 | DeCola . |
| 3,829,765 | 8/1974 | Siler . |
| 3,891,811 | 6/1975 | Miller . |
| 4,129,825 | 12/1978 | Brinegar . |
| 4,272,687 | 6/1981 | Borkan . |
| 4,642,556 | 2/1987 | Pecukonia . |
| 4,734,638 | 3/1988 | Weber . |
| 4,801,868 | 1/1989 | Brooks . |
| 4,829,570 | 5/1989 | Schotz ...................................... 455/3.3 |
| 4,906,938 | 3/1990 | Konopka . |
| 5,109,200 | 4/1992 | Dushane et al. . |
| 5,422,564 | 6/1995 | Earle . |
| 5,493,206 | 2/1996 | Boons . |
| 5,625,285 | 4/1997 | Virgilio ...................................... 324/133 |

*Primary Examiner*—Walter Snow
*Attorney, Agent, or Firm*—Sonnenschein Nath & Rosenthal

[57] ABSTRACT

A test system for distinguishing a particular AC distribution circuit interrupting device from among a plurality of AC distribution circuits interrupting devices. The test system comprises a transmitter for placing an identification signal on an AC power distribution circuit and a receiver for detecting the identification signal. The transmitter comprises means for generating an FM modulated identification signal, and means for coupling the identification signal to the AC power distribution circuit. The receiver comprises preselector means for selecting a predetermined band of frequencies for further processing, first detector means for detecting a signal within the predetermined band of frequencies, second detector means for detecting a modulating signal, and processor means for processing indications from the first and second detectors, and for activating a discernible indication of receiver operation. The transmitter may further comprise a plurality of indicator means for providing an indication that an electrical receptacle to which the transmitter is connected is wired in accordance with a predetermined arrangement.

23 Claims, 7 Drawing Sheets

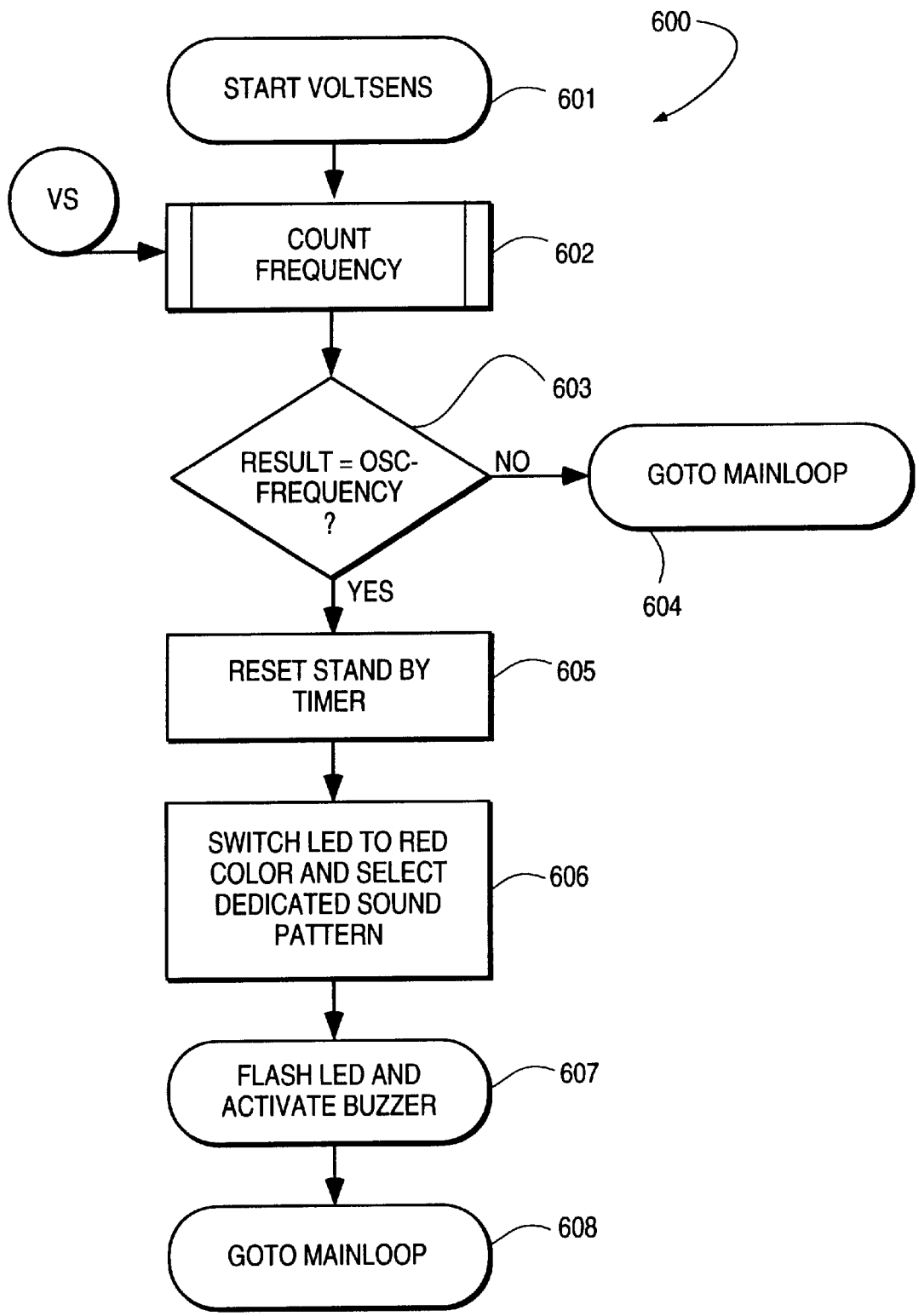

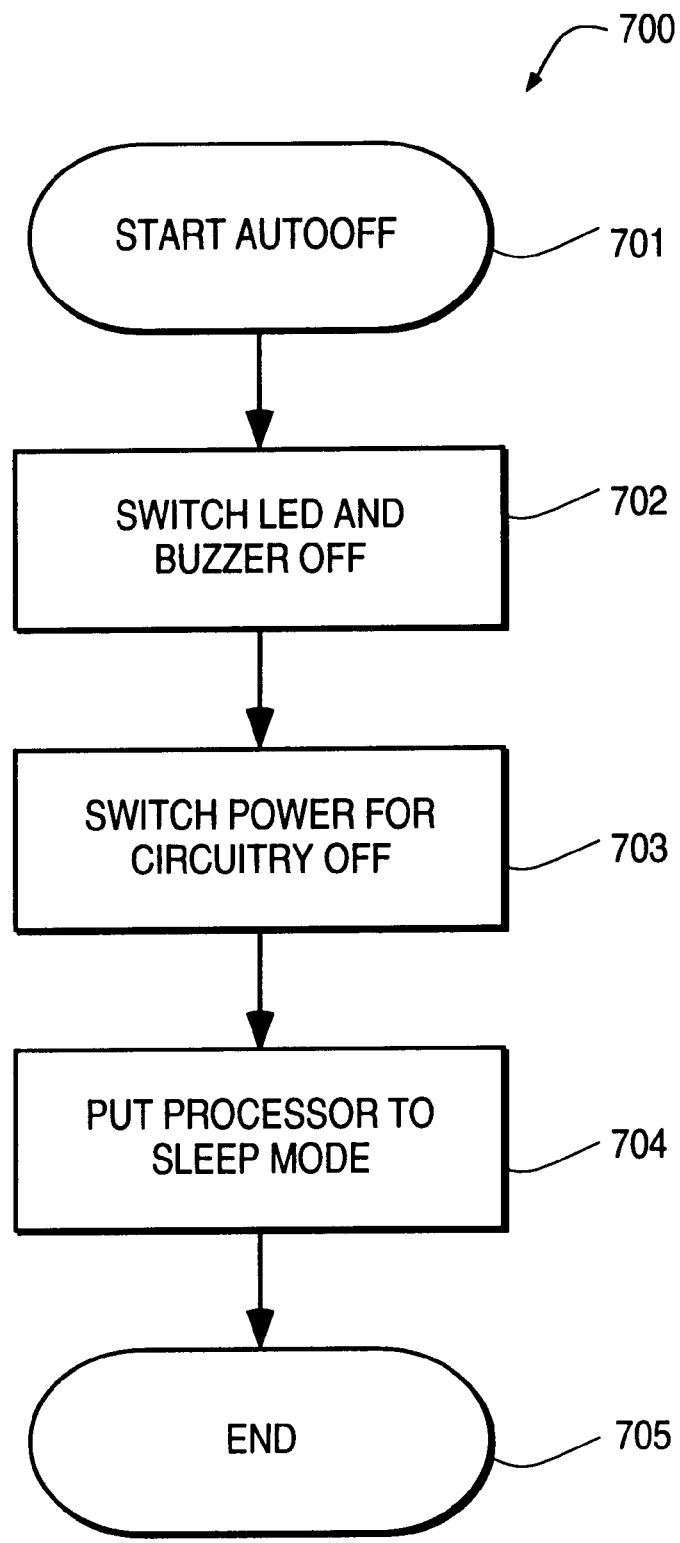

ELECTRICAL CIRCUIT BREAKER LOCATOR WITH TRANSMITTER AND RECEIVER

FIELD OF THE INVENTION

This invention relates generally to a system for locating electrical circuits interruption devices and in particular to locating AC power distribution circuits interruption devices, and is more particularly directed toward an electrical circuit interruption device locator that facilitates the location of a particular electrical distribution circuit while minimizing false indications.

BACKGROUND OF THE INVENTION

Electrical circuit breaker location devices aid the electrician in identifying a particular circuit interrupting device which is associated with a circuit on which work must be performed. In large installations such as factories and warehouses, it is simply not practical for an electrician to position himself at a circuit breaker panel, de-energize the circuits one by one, thereby disputing the power, and observe which circuit is affected. Furthermore, this practice is unsafe.

In one locator device known in the art, a transmitter unit is simply plugged in to an electrical receptacle in the circuit to be identified. In this transmitter, a diode is connected in series with an RC (resistor-capacitor) circuit and a two-terminal power switch of the thyristor type.

When the circuit is connected across the AC line, the thyristor immediately reaches its trigger voltage (the uncharged capacitor looks like a short-circuit to the line voltage) and a high amplitude spike of current is drawn from the AC line. The spike is short-lived, however, as the capacitor charges to the peak line voltage value. The repetition rate of the current spike can be controlled by the time constant of the RC network. A simple detector is provided for use at the breaker panel to detect the presence of a magnetic field caused by the current spikes propagating down the line.

Unfortunately, generator circuits of the type just described create large magnetic fields that are quite easily coupled to adjacent circuits, thus making positive identification difficult. In addition, the simple receivers employed with systems of this type are subject to false detections because of noise.

Accordingly, a need arises for an electrical circuit locator that is relatively immune to noise, and will only act to detect an identification signal provided by its own associated transmitter. The locator system should be economical and durable, and provide other functions useful to the tradesman, such as a ground fault condition indicator test circuit, electrical receptacle wiring configuration analysis, and simple detection of the presence of AC wiring within walls or other structures.

SUMMARY OF THE INVENTION

These needs and others are satisfied by the electrical circuit breaker locator of the present invention, which includes a transmitter for placing an identification signal on an AC power distribution circuit. The transmitter comprises means for generating an FM modulated identification signal, and means for coupling the identification signal to the AC power distribution circuit.

In accordance with one aspect of the invention, the means for generating an FM modulated identification signal comprises a first oscillator means for generating a carrier signal, and a second oscillator means for generating a modulating signal. The carrier signal and the modulating signal are combined to form an FM modulated identification signal. The means for coupling the identification signal to the AC power distribution circuit may comprise a transformer having an input coupled to the FM modulated identification signal and an output coupled to the AC power distribution circuit.

In another form of the invention, the transmitter further comprises a plurality of indicator means for providing an indication that an electrical receptacle to which the transmitter is connected is wired in accordance with a predetermined arrangement. The plurality of indicator means may comprise a plurality of light emitting diodes. The plurality of light emitting diodes may be illuminated in combination to indicate a wiring condition selected from the set of wiring conditions consisting of correct wiring, open ground, open neutral, reversed polarity, hot on neutral with open neutral, and unenergized circuit.

In yet another aspect of the invention, a receiver is provided for detecting an identification signal on an AC power distribution circuit. The receiver comprises preselector means for selecting a predetermined band of frequencies for further processing, first detector means for detecting a signal within the predetermined band of frequencies, second detector means for detecting a modulating signal, and processor means for processing indications from the first and second detectors, and for activating a discernible indication of receiver operation. The preselector means may comprise resonant circuit means.

The first detector means may comprise peak detector means, while the second detector means may comprise phase-lock loop means. The processor means comprises a stored-program microcontroller. The stored program microcontroller comprises a microprocessor having program memory, read/write memory, an analog-to-digital converter, and programmable inputs and outputs.

In accordance with still another aspect of the invention, a test system for distinguishing a particular AC distribution circuit from among a plurality of AC distribution circuits is provided. The test system comprises a transmitter for placing an identification signal on an AC power distribution circuit, where the transmitter in turn comprises means for generating an FM modulated identification signal, and means for coupling the identification signal to the AC power distribution circuit, and a receiver for detecting an identification signal on an AC power distribution circuit, where the receiver comprises preselector means for selecting a predetermined band of frequencies for further processing, first detector means for detecting a signal within the predetermined band of frequencies, second detector means for detecting a modulating signal, and processor means for processing indications from the first and second detectors, and for activating a discernible indication of receiver operation.

Further objects, features, and advantages of the present invention will become apparent from the following description and drawings.

BRIEF DESCRIPTION OF THE DRAWINGS

FIG. 6 is a flow chart depicting an AC line voltage sense task for a receiver in accordance with the present invention; and FIG. 7 is a flow chart illustrating the automatic turn off task for a receiver in accordance with the present invention.

DETAILED DESCRIPTION OF THE INVENTION

In accordance with the present invention, an electrical circuit locator is described that provides distinct advantages when compared to those of the prior art.

The transmitter, or signal generator, is adapted to be plugged in to an AC (alternating current) branch circuit receptacle power outlet, or, via a suitable interface network, may be connected to a lighting fixture or directly to AC power line conductors. A simple display, made up of three light emitting diodes (LEDs), indicates whether the power line connection with the unit is wired correctly.

In performing these functions, the transmitter may be used alone, while the use of the receiver (to be described subsequently) is necessary when a determination of the particular circuit interrupter (circuit breaker or fuse, for example) which is associated with the branch circuit under test is to be identified.

The transmitter generates an identification signal that is coupled to the power line, and additionally has the functionality of a receptacle analyzer and a GFCI (ground fault condition indicator) tester incorporated as well. Other units in the art that purport to perform these functions may indicate wrong wiring scenarios correctly, but may not be capable of generating an identification signal under certain wiring conditions simply because they operate from the hot side of the line with respect to either neutral or ground. The transmitter described herein will operate in multiple wiring situations, as long as the hot conductor is available on one of the three terminals, and either neutral or ground is connected to one of the remaining terminals.

Figure 1:
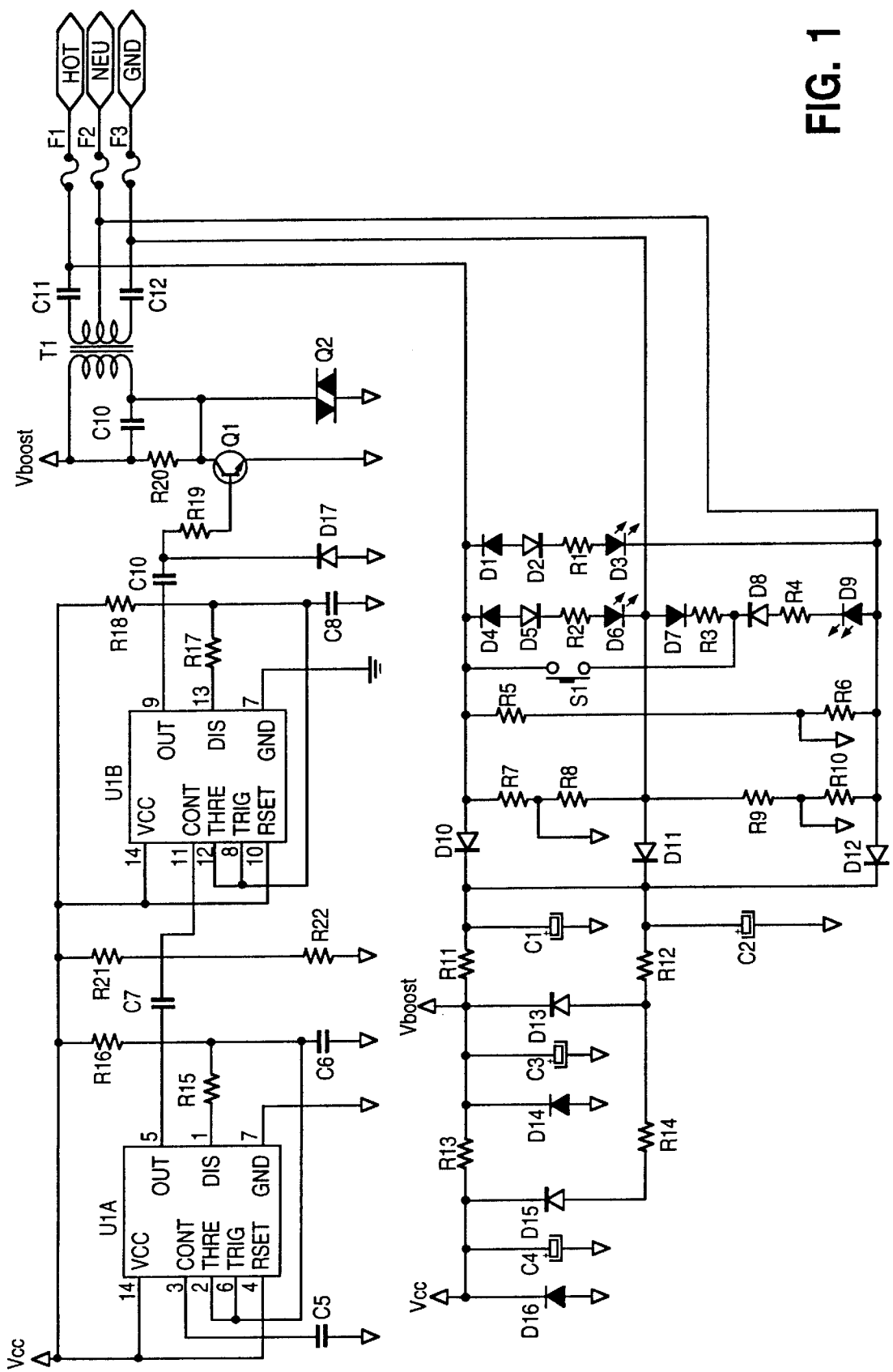
FIG. 1 is a schematic diagram of a transmitter in accordance with the present invention.

FIG. 1 depicts the transmitter circuitry in schematic diagram form. Zener diode D1, general purpose diode D2, resistor R1 and LED D3 are connected in series across the hot and the ground conductors, thereby forming a power indicator. R1 acts as a current limiting resistor, D2 prevents D3 from conducting in a reverse direction, while D1 (with its Zener voltage of 100 volts) assures that this subcircuit can be activated only if at least 100 volts are present, and therefore no leakage path can affect the brightness of D3. D4, D5, R2 and D6 form a similar subcircuit which is connected across the hot and neutral conductors.

A third subcircuit (comprising D7, R3, D8, R4 and D9) that is connected across the neutral and ground conductors serves the same purpose as described above, but varies somewhat from the other two arrangements, since there is an additional resistor employed. R3 and R4 together provide current limiting for the power indicating subcircuit, while another current path will be completed from hot to ground through D8, R4 and D9 by activating momentary pushbutton S1, thereby causing a current flow in the range of about 6 to 8 mA (milliamperes), determined by the value of R4. This current flow from hot to ground will trip any eventually installed GFCI.

Different wiring scenarios result in different illumination patterns of LEDs D3, D6 and D9, as indicated in the following table:

|  | D3 | D6 | D9 |
|---|---|---|---|
| Correct wiring | ON | ON | OFF |
| Open ground | OFF | ON | OFF |
| Open neutral | ON | OFF | OFF |
| Reversed polarity | OFF | ON | ON |
| Hot on neutral with open neutral | OFF | OFF | ON |
| Unenergized circuit | OFF | OFF | OFF |

The following arrangement forms a transformerless power supply which meets UL requirements and provides two separate DC (direct current) voltages of approximately 30 V (volts) and 15 V, independent of the wiring scenario on the terminals to which the unit is connected. Resistor pairs R5 and R6 (connected across hot and ground), R7 and R8 (connected across hot and neutral), and R9 and R10 (connected across neutral and ground) are three similar voltage dividers which provide, on their respective center taps, a virtual signal ground. Diodes D10, D11 and D12 are working, in a combination dependent upon the particular wiring scenario, as two-way rectifiers. Electrolytic capacitors C1 and C2 are filter capacitors for smoothing the DC voltage provided by the rectifiers.

Resistor combinations R11 and R13, R12 and R14 are further voltage dividers, and are providing the two necessary DC voltages for the rest of the circuitry. Electrolytic capacitors C3 and C4 are also filter capacitors, while Zener diodes D14 and D16 are employed as voltage stabilizers for $V_{boost}$ (30V) and $V_{cc}$ (15V). General purpose diodes D13 and D15 prevent unwanted DC feedback.

The remaining portion of the device circuitry, which will be introduced next, forms a frequency-modulated (FM) carrier current system (CCS). Common CCSs are usually amplitude modulated (AM). That kind of technique would be unsuitable for the purpose of this device, since the level of the amplitude serves as an identification criterion. In other words, amplitude is the quantitative evaluation unit for the receiver, as will be discussed in more detail subsequently. FM systems are less subject to distortion and electrical noise, which is desirable for proper system operation.

The center of the CCS is built around two versatile timer circuits, while the generated FM is boosted by a single transistor transformer-coupled to the power line. Both timers, U1A and U1B, are preferably configured as astable multivibrators with selectable duty cycle.

Capacitor C5 is not necessarily required, yet provides a quite simple improvement of stability for timer circuit U1A. Capacitor C6, resistor R15, and resistor R16 are the frequency-determining components for the multivibrator U1A. Frequency and duty cycle are given by the following formulae:

$$t_1 = 0.693 * R16 * C6$$

$$t_2 = [(R16*R15)/(R16+R15)]*C6*ln[(R15-2*R16)/(2*R15-R16)]$$

$$f = 1/(t_1 + t_2)$$

$t_1$ is the time period during which the output is low $t_2$ is the time period during which the output is high f is the free running frequency 0.693 is a constant, provided by the device manufacturer Timer U1B works in the same manner, with the only difference being that its modulation input is fed through capacitor C7 with the output of timer U1A. The frequency and duty cycle of U1B are given by the same formulae as for U1A, but R16 has to be replaced with R18, R15 with R17, and C6 with C8.

The free running frequency, or carrier frequency fc of U1B has been chosen to be 500 kHz (kilohertz), which is high enough to be effectively coupled to the AC line at a 50% duty cycle. The modulation sensitivity of U1B under the selected bias conditions, with Vcc=15 V, is about ±0.66 fc/V. For minimum distortion, the deviation should be limited to ±10%; thus maximum input at pin 11 of U1B is ±0.15 V. A reduction due to the dividing network R21 and R22 brings the required input to about 0.2 V RMS (root mean square) for ±10% modulation of fc, based on the nominal output level from multivibrator U1A.

The output at pin 9 of U1B, being a frequency-modulated square wave of approximately 7 V peak-to-peak, is AC coupled through capacitor C9 and current limiting resistor R19 to the base of booster transistor Q1. Because coupling transformer T1's primary winding in conjunction with capacitor C10 forms a parallel resonant tank whose resonant frequency fr is tuned to the carrier frequency fc, it appears as a high impedance collector load, so Q1 need not have additional current limiting. Resistor R20 is of relatively low value, and is employed only as additional protection.

The collector signal may be as much as 50 to 60 V peak-to-peak. Therefor, surge protector Q2, with a break-over voltage of 70 V, gives further protection.

The transformer was selected for optimized use in the range of 400–600 kHz, with unloaded Q ($Q_U$) of about 35, and loaded Q ($Q_L$) of about 12. Since circulating current in the resonant tank is $3A_{RMS}$, C10 should have a low series resistance (1 ohm is too much). Therefore, a polypropylene capacitor was selected.

The turns ratio of the secondary winding of T1 has been chosen to drive industrial and residential power line impedances of 3.5, 7 and 14 ohms respectively. Coupling capacitors C11 and C12 function primarily to block the power line voltage from T1's line-side winding. Also, C11, T1's line-side winding, and C12 comprise a LC high pass filter. The self-inductance of T1 is far too low to support a direct line connection. C11 and C12 must have a low enough impedance (below the lowest expected line impedance, which is about 3.5 ohms) at fc to allow T1 to drive transmitted energy onto the line. This precaution also helps to ensure that T1 will be kept well out of saturation due to excessive power line current.

The resultant transmitter device, which places an identification signal on the power line system, is extremely efficient because the attenuation of the carrier is very low, thus the system described can be used at a greater distance from the circuit interrupter to be identified than can other system known in the art.

Figure 2:
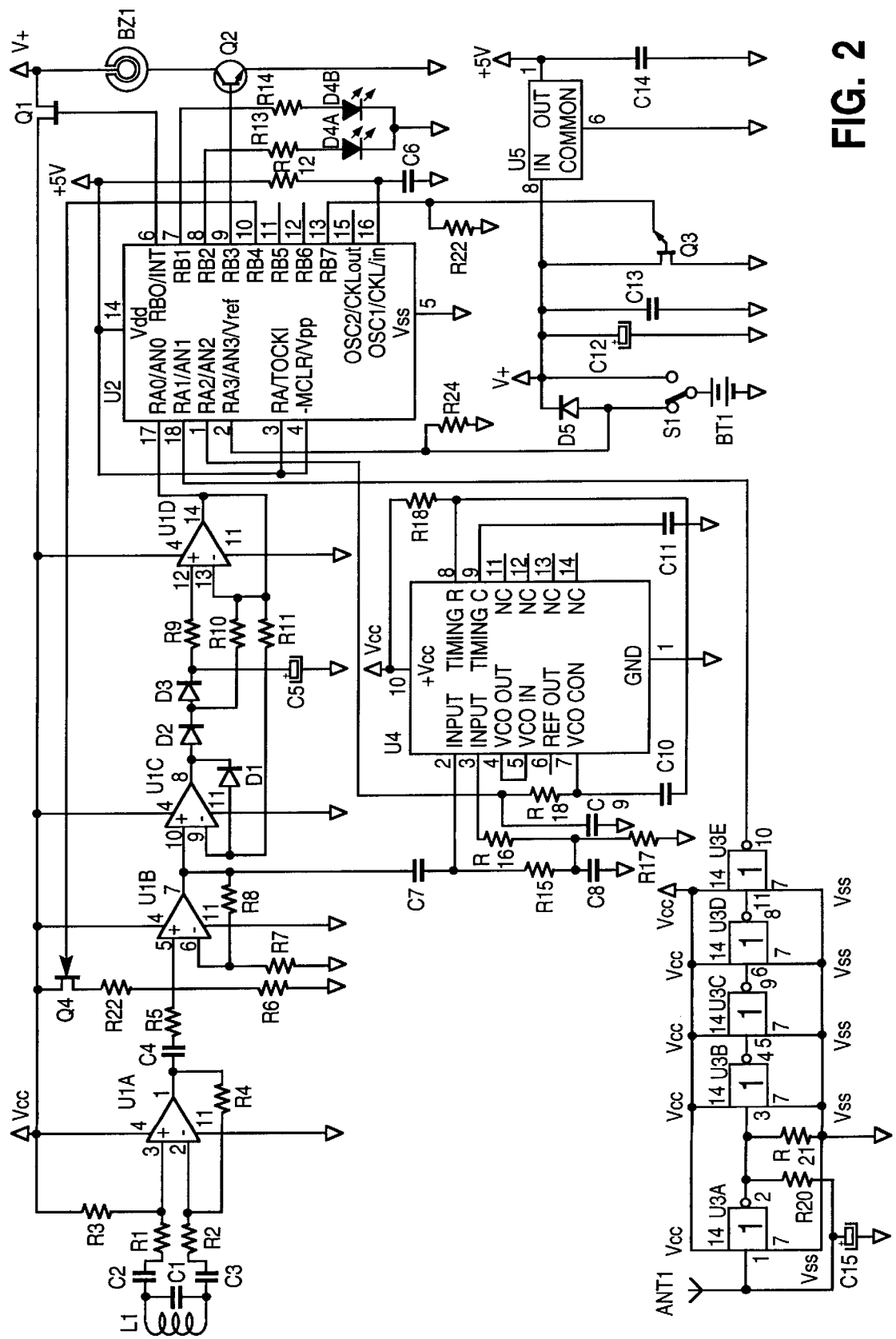
FIG. 2 is a schematic diagram of a receiver in accordance with the present invention.

The receiver system, or signal detector, that is designed to operate with the transmitter just described, and is set forth in schematic form in FIG. 2, is preferably a hand-held device powered by a standard 9 V battery. It can be used as a stand alone device (without using the transmitter), for the purpose of detecting a low frequency magnetic field as it is formed around power line conductors when they are energized. When the receiver is utilized to scan the energized wiring system, the unit may be used as either a locator for the circuit interrupting device (circuit breaker or fuse) which protects that particular branch circuit where the transmitter is connected, or the Receiver can be used to trace energized power line wires which are hidden behind solid objects such as walls, conduits or other obstructions. Two further features are an automatic power-off function and a low battery indicator.

The receiver system is built around a PIC16C71, an 8-bit microcontroller, although other suitable microcontroller devices would also function adequately. A number of integrated circuits and discrete components, such as OP-AMPs CMOS-Gates and transistors, help to complete the design. The system design described below was selected in lieu of a highly integrated signal processor based system because of the better price efficiency, but the receiver could also be designed using a signal processor implementation.

Switch S1, with three positions (ON-OFF-ON), serves as the power-on switch as well as a mode selector. Switch position 1 (ON) achieves nothing else but providing the power supplied by battery BT1 to a part of the circuitry, while position 3 (ON) serves exactly the same purpose but additionally feeds pin 2 of the microcontroller U2 with a logic HIGH, thereby indicating that the wire tracer mode is selected. Pin 2 of U2 is usually pulled down to ground by resistor R24, so U2 receives an indication that the standard operational mode is selected. General purpose diode D5 assures that no power may be fed to pin 2 of U2 when S1 is in position 1. Capacitors C12 and C13 are common decoupling capacitors.

Voltage detector Q3's output goes logically HIGH when its input voltage falls below a level of 5.6 V, and indicates to pin #13 of U2 that a low battery situation has been reached. Resistor R23 keeps pin 13 of U2 at a logic LOW to indicate to U2 that the battery voltage of BT1 is within the correct range. Voltage regulator U5 is powered by battery BT1 and provides, on output pin 1, a voltage of 5.1 V DC which is used to power U2. Capacitor C14 decouples this voltage from any kind of ripple.

When S1 is placed in either position 1 or 3, power is supplied to input pin 3 of U5, to piezo buzzer BZ1, and to the collector of N-channel JFET (junction field effect transistor) Q1. (In position 3, power is also provided to pin 2 of U2 as mentioned above). Since U5 is powered in either one of the two ON positions, U2 is powered as well by output pin 1 of U5. U2 is equipped with an on-board power-on reset circuit, so it will start operating immediately after power has been supplied.

The operating clock of 20 MHz (megahertz) for U2 is generated by a simple RC oscillator comprising resistor R12 and capacitor C6. Pin 16 is the clock input pin for U2.

As soon as U2 starts operating, it checks whether the voltage of battery BT1 is at a suitable level. If U2 detects that the battery voltage is too low, it will raise its output pins 7 and 8 HIGH, and thereby allow LEDs D4A and D4B to be supplied, through resistors R13 and R14, with the correct current to light up in yellow. It should be noted that D4A and D4B are preferably physically one single component (dual color LED with common cathode), although they may also be provided separately. U2 will furthermore bias transistor Q1 randomly on for a short time, so it goes into conduction and causes BZ1 to generate a distinctive sound of short duration whose frequency is determined by U2 s software. This action alerts a user of the device that the voltage of BT1 is too low for proper operation.

If, on the other hand, BT1's voltage is within the required range, U2 will execute a simple self-test. This means, first, that D4A and D4B will be illuminated yellow and BZ1 will be fed with an associated sound pattern, determined by software; second, only D4A will be activated, causing the LED to light red, and another sound pattern will be fed to BZ1 through Q2; third, D4B will be forced to light up green and BZ1 (through Q2) is provided with another software-determined sound pattern.

U2 then checks whether pin 2 is at a logic HIGH, which may be caused by S1 in position 3. If so, the wire tracer mode is selected, and the appropriate software routines will be activated. If pin 2 is LOW, the software routines for standard operation will be selected. Then, regardless if whether wire tracer or standard mode is selected, the software will cause U2's pin 8 to go HIGH, which in turn biases the gate of Q1, forcing Q1 into conduction and powering the remainder of the circuitry. Next, U2 s integrated counter is activated to determined if the device should be switched off (auto power-off function).

U1 is a single-supply general purpose quad OP-AMP (LM324). Its first stage U1A is configured as a differential, non-inverting AC amplifier with negative feedback and a gain of about 200. Pick-up coil L1 and capacitor C1 comprise a broadly tuned resonant tank, whose output is fed through the RC combination of C2, R1 and C3, R2 to the input of the first amplifier stage (preamplifier). The output of this stage is then AC coupled through capacitor C4 to a general purpose AC amplifier stage comprised of U1B and its associated components R5, R6, R7 and R8. This stage is configured such that the post amplified signal can never drive the OP-AMP into saturation, at least as long as transistor Q4 has not been biased into conduction. Transistor Q4 and resistor R22 together comprise a variable resistor, controlled by the gate current of Q4 through pin 10 of U2.

U1B's output is split two ways. First, it feeds a fast responding peak voltage detector formed by U1C, U1D, and their associated components, diodes D1, D2, and D3, resistors R9, R10, and R11, and capacitor C5. The output of the detector is the DC equivalent of the peak voltage sensed by L1 and amplified by U1A and U1B. The second path for U1B's output feeds through capacitor C7 to the input of U4, a phase lock loop (PLL) detector of a type well-known in the art. Resistors R15, R16, and R17, in conjunction with capacitor C8 comprise an RC filter for U4's input. Resistor R19 and capacitor C11 are the timing components for the PLL, while resistor R18 and capacitors C9 and C10 determine the frequency of U4's integrated voltage-controlled oscillator (VCO). The output of the PLL is fed to pin 1 of U2 so that U2 has access to the modulated information placed on the power line by the transmitter unit.

A simple conductor such as a length of wire of metal portion serves as antenna ANT1 to pick up a low frequency magnetic field of sufficient strength. A CMOS hex inverter U3 is fed by the output signal of the antenna ANT1 to an oscillator formed by U3A, resistor R20, and capacitor C15. Resistor R21 determines the sensitivity of the next inverting stage U3B, which also acts as an amplifier. U3C, U3D, and U3E are simple inverting stages that provide a small amount of gain. U3E's output triggers pin 18 of U2, indicating that a power line magnetic field has been detected.

The power line magnetic field detection capability just described could also be characterized as an AC voltage sensor function. This particular function of the receiver is provided as a safety feature that represents a technical advance over devices known in the art.

While the transmitter has been described as providing a receptacle analysis capability that will indicate (under certain circumstances) that a particular circuit is unenergized, this kind of receptacle analysis is also advertised with at least some prior art devices. In some situations, however, an indication from a simple receptacle analyzer that a particular circuit is unenergized can be misleading. If the hot side of the AC line is properly connected to a particular AC receptacle, and neither the ground nor neutral is connected, most simple receptacle analyzers will indicate that the circuit is unenergized. This false indication comes about because the receptacle analyzer has no power applied without a connection to either the hot or neutral conductor of the AC distribution system. Under these circumstances, a user may assume that he can safely work on an installation, when in reality there is an energized hot wire in the receptacle installation under test. This condition might be characterized as a "floating HOT" condition.

The inventive receiver unit provides an additional safety feature by virtue of its AC voltage sensor function. Even if the inventive transmitter unit shows that a particular receptacle is unenergized, the receiver unit will provide an indication that an AC voltage exists even in the "floating HOT" scenario mentioned above, because the magnetic field surrounding the hot conductor can still be detected by the inventive receiver unit.

Figure 3:
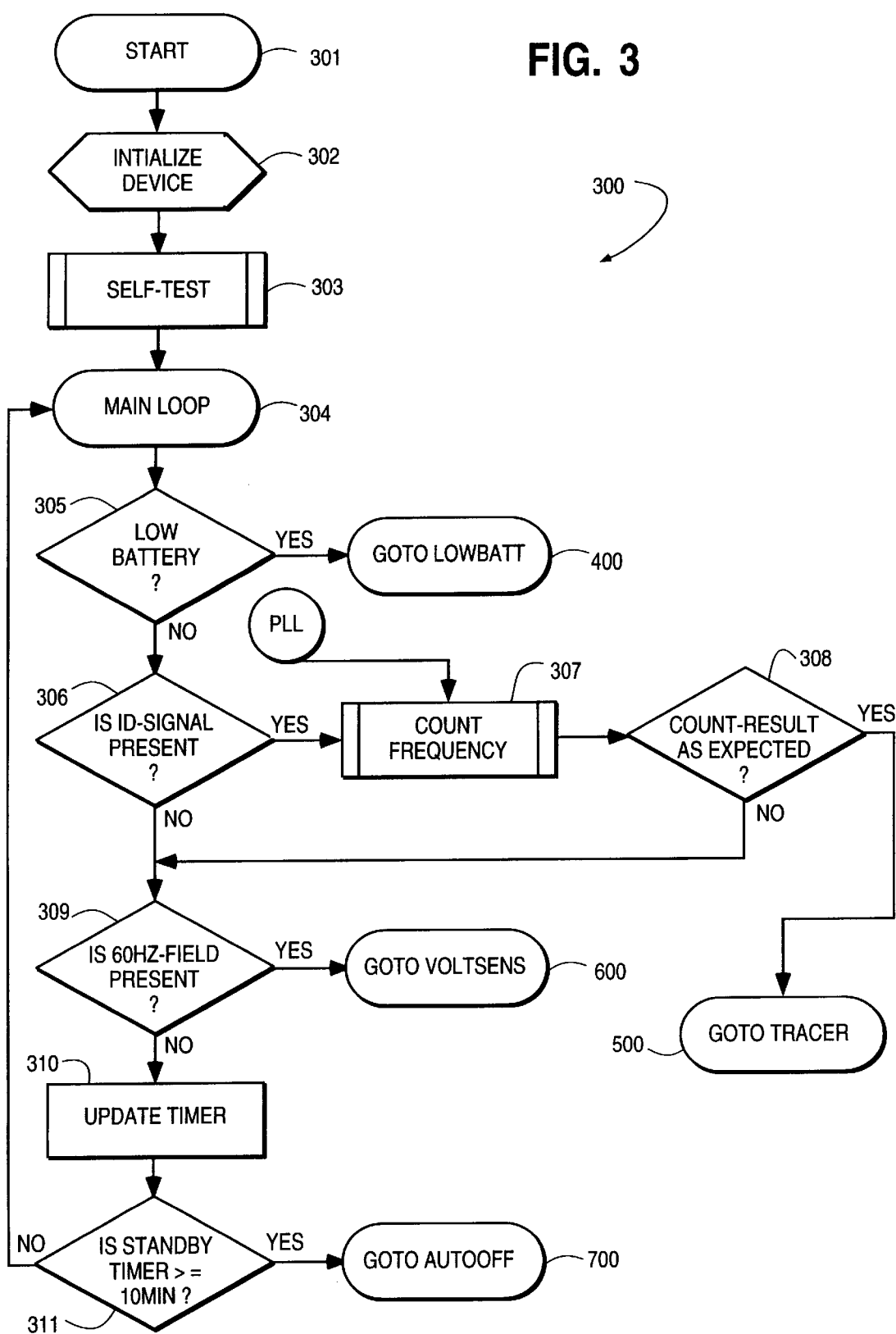
FIG. 3 is a flow chart depicting operation of the stored program for a receiver in accordance with the present invention.

Insofar as software operation is concerned, a flow chart of program operation is provided in FIG. 3, generally depicted by the numeral 300. After a start state 301, the device is initialized in the subsequent step 302 and a self-test is performed (step 303). When the main loop 304 is entered, the first test performed in the low battery test of step 304. Execution of the low battery test will be described subsequently in conjunction with FIG. 4.

The next process in the main loop is the ID signal test (step 306). First, the peak detector output is checked to determine whether an ID signal is present. Then, the phase lock loop output is counted to determine its frequency (step 307). In the next step 308, the counter value is checked against the expected result for the modulating frequency of the transmitter, and the tracer module 500 is executed. Execution of the tracer will be described in conjunction with FIG. 5.

If the ID signal is not present, the system checks for the presence of a 60 Hz field (step 309) at the output of the 60 Hz detector. If a 60 Hz value is detected, the voltage sense portion of the software, which is described below, is executed. If there is no 60 Hz field present, the timer is updated in the subsequent step 310, and then the value is checked to determine whether ten minutes have elapsed (step 311). If not, the main loop 304 is re-entered. If ten minutes have, in fact, elapsed since the last activity was detected, the AutoOff portion of the software is executed.

FIG. 7 is a flow chart of the AutoOff portion of the software, generally depicted by the numeral 700. After a start state 701, the LED and buzzer circuitry are turned off (step 702), and, in the next step 703, power for all of the circuitry is removed. In the subsequent step 704, the processor is placed in sleep mode, and the AutoOff task ends.

Figure 4:
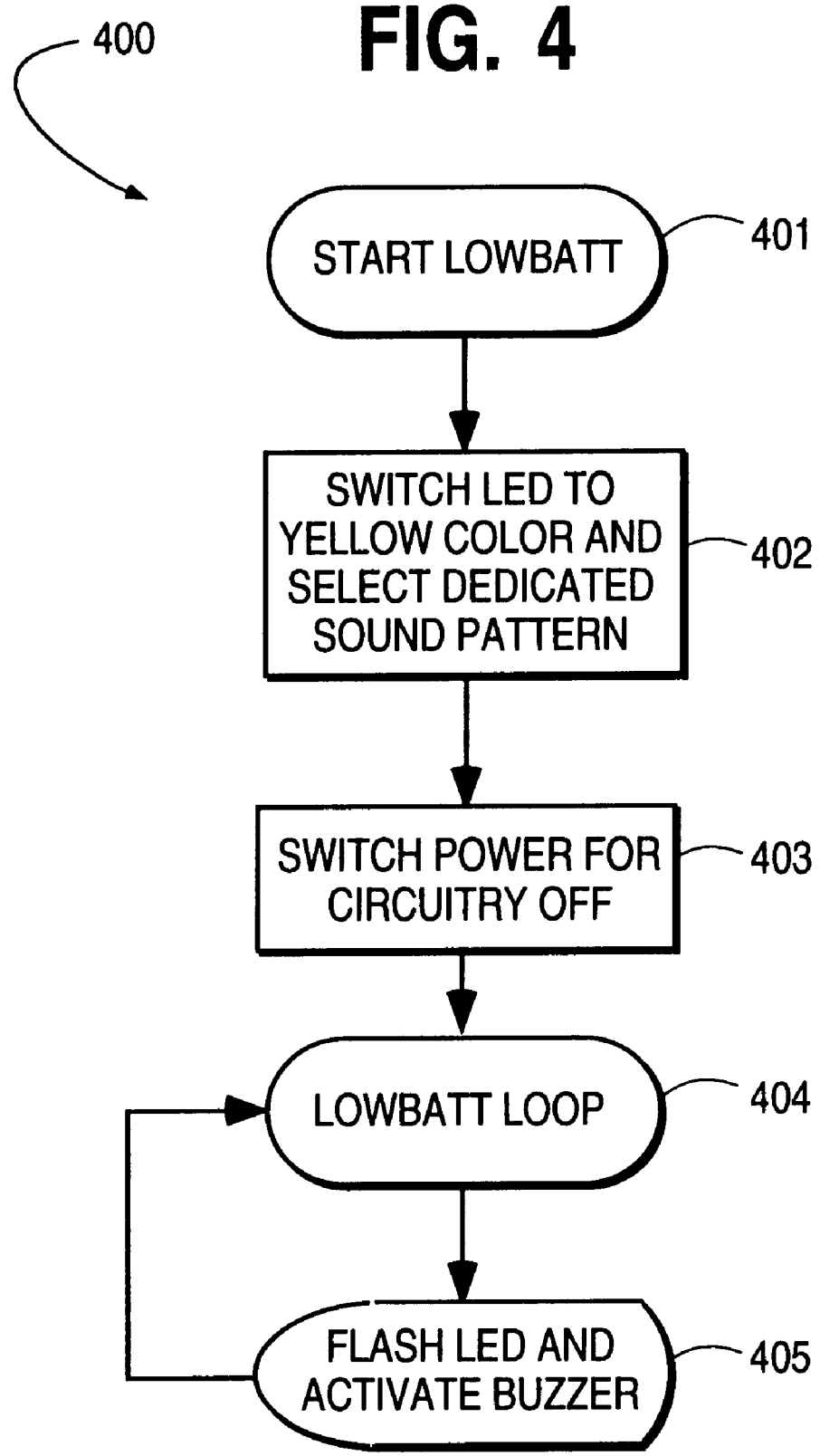
FIG. 4 is a flow chart of the low battery task portion of the stored program for a receiver in accordance with the present invention.

FIG. 4 is a flow chart of the low battery task 400. After a start state 401, the LED is switched to a yellow color and the preselected sound pattern that indicates low battery is selected (step 402). Power for the circuitry is removed in the next operation 403, and the low battery loop 404 is entered in which the LED is flashed and the buzzer activated (step 405) periodically.

Figure 5:
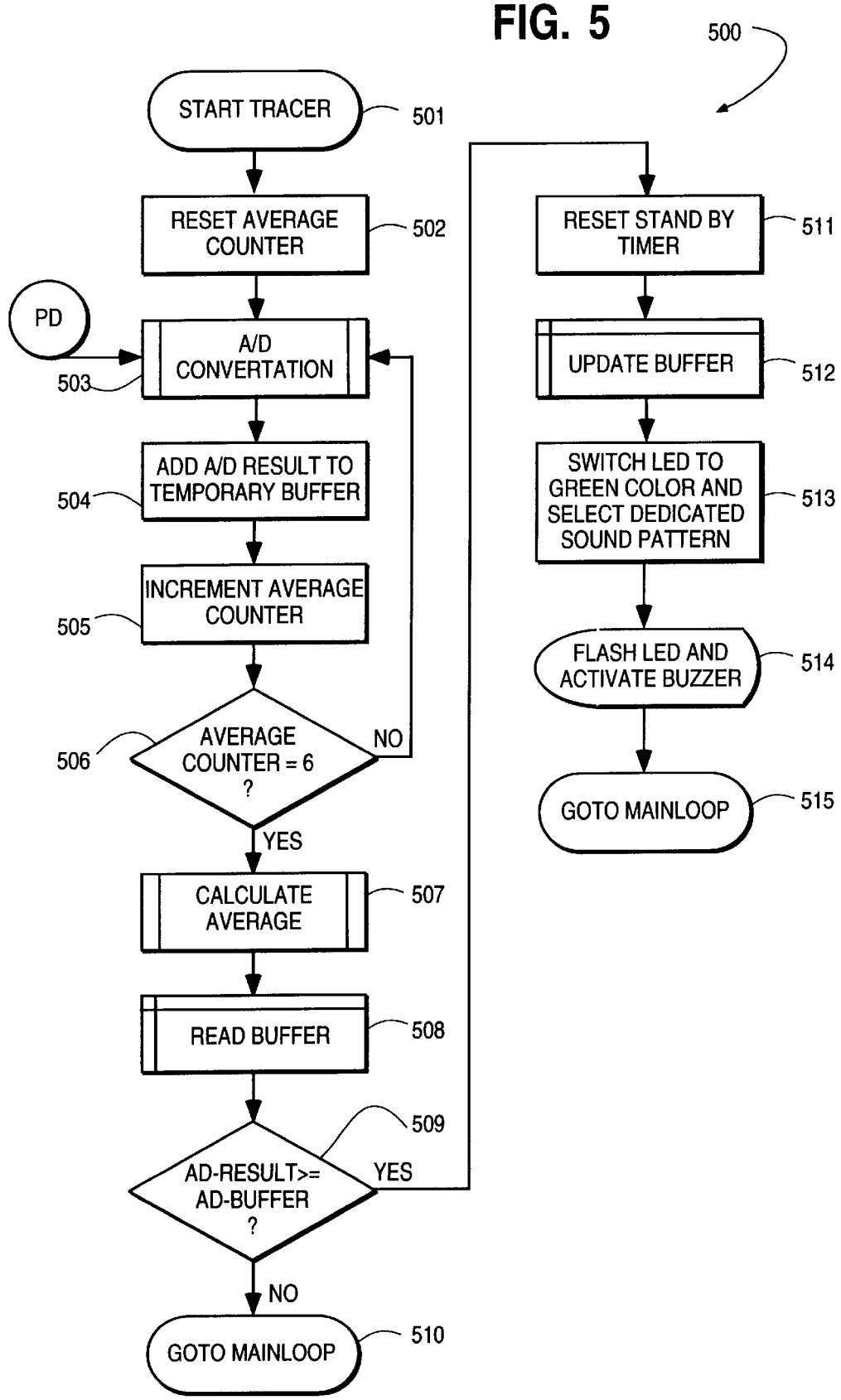
FIG. 5 is a flow chart of a task that determines whether the carrier signal of an FM modulated identification signal is present for a receiver in accordance with the present invention.

FIG. 5 depicts the tracer operation, generally depicted by the numeral 500, in flow chart form. After resetting the average counter (step 502), the program performs an analog-to-digital conversion (A/D) of the phase detector output (step 503), and, in the next step 504 adds the A/D result to a temporary buffer location. The average counter is incremented in the next operation 505 to track the number of A/D conversions performed for the averaging operation and the counter is checked (step 506) to determine whether six A/D operations have been performed. If not, another A/D operation is performed in step 503 and the process is repeated.

If, on the other hand, six A/D conversions have been performed, the average is computed (step 507) and the latest average is compared to the buffered value (step 509). If the latest average is not greater than or equal to the buffered value, the main loop is re-entered at step 510. If the average indicates that a signal is present, then a standby timer is reset (step 511), the buffer value is updated to reflect the current result (step 512), and the LED is switched to green as a predetermined sound pattern is selected for the piezo buzzer (step 513). In the subsequent step 514, the LED is flashed and the buzzer activated, then the main loop is once again entered.

The ability to buffer the average value and to compare the latest average with the prior buffered value makes the receiver of the present invention a self-adjusting receiver, thus achieving yet another technical advance over prior art units. In receivers of the prior art that perform similar locating and identifying functions, the user must generally adjust a potentiometer to optimize receiver sensitivity. If the sensitivity is set too low, the receiver of the prior art will never detect an identification signal. On the other hand, if the sensitivity is set too high, the receiver will "detect" identification signals that are not present.

In the present invention, the most recently acquired average value of the A/D converter results is stored (buffered) for later comparison.

As described above, unless the newly computed average value is greater than or equal to the stored value, the tracer routine simply re-enters the main loop. Thus, carrier signal amplitudes that are not at least as great as the prior measured value are ignored, and the threshold for acknowledging the presence of a carrier signal is continuously adjusted to the largest value measured. This virtually eliminates false detection of a carrier and provides a receiver unit with a self-adjusting capability as regards receiver unit sensitivity.

The flow chart of FIG. 6 depicts the voltage sense operation (600) mentioned previously. After a start state 601, the voltage sense output is counted (step 602) and compared to the oscillator frequency in the subsequent process 603. If there is no match, the main loop is re-entered (step 604).

If, on the other hand, a match is detected, the LED is switched to red and a dedicated pattern corresponding to AC voltage detection is selected for the piezo buzzer (step 606). In the next operation 607, the LED is flashed and the buzzer activated, followed by a return to the main loop (step 608).

There has been described herein an electrical circuit locator that is relatively free from the shortcomings of the prior art. It will be apparent to those skilled in the art that modifications may be made without departing from the spirit and scope of the invention. Accordingly, it is not intended that the invention be limited except as may be necessary in view of the appended claims.

What is claimed is:

1. A transmitter for placing an identification signal on an AC power distribution circuit the transmitter comprising:
   means for generating an FM modulated identification signal, wherein the means for generating an FM modulated identification signal includes:
   a first oscillator means for generating a carrier signal, and
   a second oscillator means for generating a modulating signal,
   wherein the carrier signal and the modulating signal are combined to form an FM modulated identification signal; and
   means for coupling the identification signal to the AC power distribution circuit.

2. The transmitter of claim 1, wherein the means for coupling the identification signal to the AC power distribution circuit comprises a transformer having an input coupled to the FM modulated identification signal and an output coupled to the AC power distribution circuit.

3. The transmitter of claim 1, further comprising a plurality of indicator means for providing an indication that an electrical receptacle to which the transmitter is connected is wired in accordance with a predetermined arrangement.

4. The transmitter of claim 3, wherein the plurality of indicator means comprises a plurality of light emitting diodes.

5. The transmitter of claim 4, wherein the plurality of light emitting diodes is illuminated in combination to indicate a wiring condition selected from the set of wiring conditions consisting of:
   correct wiring;
   open ground;
   open neutral;
   reversed polarity;
   hot on neutral with open neutral; and
   unenergized circuit.

6. A receiver for detecting an identification signal on an AC power distribution circuit, the receiver comprising:
   preselector means for selecting a predetermined band of frequencies for further processing;
   first detector means for detecting a signal within the predetermined band of frequencies;
   second detector means for detecting a modulating signal; and
   processor means for processing indications from the first and second detectors, and for activating a discernible indication of receiver operation, wherein the discernible indication of receiver operation is a visual indication.

7. The receiver of claim 6, wherein the preselector means comprises resonant circuit means.

8. The receiver of claim 6, wherein the first detector means comprises peak detector means.

9. The receiver of claim 6, wherein the second detector means comprises phase-lock loop means.

10. The receiver of claim 6, wherein the processor means comprises a stored-program microcontroller.

11. The receiver of claim 10, wherein the stored program microcontroller comprises a microprocessor having program memory, read/write memory, an analog-to-digital converter, and programmable inputs and outputs.

12. A test system for distinguishing a particular AC distribution circuit from among a plurality of AC distribution circuits, the test system comprising:
   a transmitter for placing an identification signal on an AC power distribution circuit, the transmitter comprising:
   means for generating an FM modulated identification signal; and
   means for coupling the identification signal to the AC power distribution circuit; and
   a receiver for detecting an identification signal on an AC power distribution circuit, the receiver comprising:
   preselector means for selecting a predetermined band of frequencies for further processing;

first detector means for detecting a signal within the predetermined band of frequencies;

second detector means for detecting a modulating signal; and processor means for processing indications from the first and second detectors, and for activating visual indicia of receiver operation, wherein the discernible indication of receiver operation is a visual indication.

13. The receiver of claim 7, wherein the means for detecting presence of an AC line voltage comprises a circuit configured to oscillate at a predetermined frequency in response to an input signal derived from an antenna positioned in proximity to said single conductor.

14. A transmitter for placing an identification signal on an AC power distribution circuit, the transmitter comprising:

means for generating an FM modulated identification signal, wherein the identification signal induces a radiating magnetic field having a substantially stable predetermined frequency; and means for coupling the identification signal to the AC power distribution circuit.

15. A transmitter for placing an identification signal on an AC power distribution circuit, the transmitter comprising:

means for generating an FM modulated identification signal, wherein the identification signal induces a substantially stable magnetic field of a predetermined frequency; and means for coupling the identification signal to the AC power distribution circuit.

16. The transmitter of claim 15, wherein the means for generating an FM modulated identification signal comprises:

a first oscillator means for generating a carrier signal; and a second oscillator means for generating a modulating signal;

wherein the carrier signal and the modulating signal are combined to form an FM modulated identification signal.

17. The transmitter of claim 16, wherein the means for coupling the identification signal to the AC power distribution circuit comprises a transformer having an input coupled to the FM modulated identification signal and an output coupled to the AC power distribution circuit.

18. The transmitter of claim 14, further comprising a plurality of indicator means for providing an indication that an electrical receptacle to which the transmitter is connected is wired in accordance with a predetermined arrangement.

19. The transmitter of claim 18, wherein the plurality of indicator means comprises a plurality of light emitting diodes.

20. The transmitter of claim 19, wherein the plurality of light emitting diodes is illuminated in combination to indicate a wiring condition selected from the set of wiring conditions consisting of:

correct wiring;

open ground;

open neutral;

reversed polarity;

hot on neutral with open neutral; and unenergized circuit.

21. A system for locating circuit breakers in an AC power distribution circuit comprising:

a transmitter for generating and coupling an identification signal on the AC power distribution circuit, the identification signal inducing a radiating magnetic field; and a receiver for receiving the identification signal via the radiating magnetic field, wherein the receiver includes a preselector means for selecting a predetermined band of frequencies for further processing;

a first detector means for detecting a signal within the predetermined band of frequencies;

a second detector means for detecting a modulating signal; and a processor means for processing indications from the first and second detectors, and for activating a discernible indication of receiver operation.

22. The system of claim 21, wherein the discernible indication of receiver operation is a visual indication.

23. The test system of claim 21, wherein the discernible indication of receiver operation is an audible indication.

* * * * *